(12) United States Patent
Nagai et al.

(10) Patent No.: US 7,332,415 B2
(45) Date of Patent: Feb. 19, 2008

(54) SILICON WAFER DIVIDING METHOD AND APPARATUS

(75) Inventors: Yusuke Nagai, Tokyo (JP); Satoshi Kobayashi, Tokyo (JP); Yukio Morishige, Tokyo (JP)

(73) Assignee: Disco Corporation, Tokyo (JP)

( * ) Notice: Subject to any disclaimer, the term of this patent is extended or adjusted under 35 U.S.C. 154(b) by 205 days.

(21) Appl. No.: 10/978,005

(22) Filed: Nov. 1, 2004

(65) Prior Publication Data

US 2005/0095817 A1    May 5, 2005

(30) Foreign Application Priority Data

Nov. 5, 2003   (JP) .............................. 2003-376098

(51) Int. Cl.
*H01L 21/00* (2006.01)

(52) U.S. Cl. ............................... 438/463; 257/E21.599

(58) Field of Classification Search ................. 438/463
See application file for complete search history.

(56) References Cited

U.S. PATENT DOCUMENTS 5,151,389 A  *  9/1992  Zappella .................... 438/68
5,552,345 A  *  9/1996  Schrantz et al. ............. 438/460
6,562,698 B2 *  5/2003  Manor ......................... 438/460
6,563,082 B2 *  5/2003  Terada et al. ........... 219/121.72
6,744,009 B1 *  6/2004  Xuan et al. ............ 219/121.67
2001/0035401 A1 * 11/2001  Manor ................... 219/121.72

FOREIGN PATENT DOCUMENTS

JP    2002-192367    7/2002
JP    2003-088975    3/2003

* cited by examiner

*Primary Examiner*—Lex Malsawma
(74) *Attorney, Agent, or Firm*—Smith Gambrell & Russell, LLP

(57) ABSTRACT

A method of dividing a silicon wafer along predetermined dividing lines, comprising a deteriorated layer forming step for forming deteriorated layers exposed to at least a surface to which a laser beam is applied, from the inside of the silicon wafer by applying a pulse laser beam with a wavelength capable of passing through the silicon wafer to the silicon wafer along the dividing lines; and a dividing step for dividing the silicon wafer along the dividing lines by applying a laser beam having absorptivity for the silicon wafer to the silicon wafer along the dividing lines where the deteriorated layers have been formed, from the side to which the deteriorated layers have been exposed, to generate thermal stress along the dividing lines.

9 Claims, 7 Drawing Sheets

SILICON WAFER DIVIDING METHOD AND APPARATUS

FIELD OF THE INVENTION

The present invention relates to a method and apparatus for dividing a silicon wafer along predetermined dividing lines.

DESCRIPTION OF THE PRIOR ART

In the production process of a semiconductor device, a large number of rectangular areas are sectioned by cutting lines called "streets" arranged in a lattice pattern on the front surface of a substantially disk-like silicon wafer and a circuit such as IC, LSI or the like is formed in each of the rectangular areas. Individual semiconductor chips are manufactured by dividing this silicon wafer having a large number of circuits formed thereon along the cutting lines. The semiconductor chips are widely used in electric equipment such as mobile telephones and personal computers. Dividing along the cutting lines is generally carried out by a cutting machine called "dicer". This cutting machine comprises a chuck table for holding a workpiece such as a silicon wafer, a cutting means for cutting the workpiece held on the chuck table, and a moving means for moving the chuck table and the cutting means relative to each other. The cutting means has a rotary spindle that is rotated at a high speed and a cutting blade mounted to the spindle. The cutting blade comprises a disk-like base and an annular cutting edge that is mounted to a side wall peripheral portion of the base and formed as thick as about 20 μm by fixing diamond abrasive grains having a diameter of about 3 μm to the base by electroforming.

As a means of dividing a plate-like workpiece such as a silicon wafer, a laser beam processing method for applying a pulse laser beam capable of passing through the workpiece to the workpiece with its focusing point on the inside of the area to be divided is attempted, and disclosed by JP-A 2002-192367, for example. The dividing method using this laser beam processing technique is to divide the workpiece by applying a pulse laser beam with an infrared range capable of passing through the workpiece to the workpiece from one surface side of the workpiece with its focusing point on the inside to continuously form deteriorated layers along the dividing lines in the inside of the workpiece and then, exerting external force along the deteriorated layers.

There is also proposed a method of dividing a workpiece by applying a pulse laser beam with an infrared range capable of passing through the workpiece to the workpiece from one surface side of the workpiece with its focusing point on the inside to continuously form deteriorated layers in the inside of the workpiece along the dividing lines and then, applying a laser beam having absorptivity for the workpiece along the dividing lines to generate stress thereby dividing the workpiece, as disclosed by JP-A 2003-88975, for example.

In the above dividing method disclosed by JP-A 2002-192367, however, when external force is exerted along the deteriorated layers formed in the inside of the workpiece, large external force must be applied along the deteriorated layers because the deteriorated layers lie out of sight in the inside of the workpiece. Hence, there is a problem that the chips may be broken.

In the above dividing method disclosed by JP-A 2003-88975, as the deteriorated layers are formed in the inside of the workpiece, large thermal stress is needed to divide the workpiece, whereby the chips are damaged due to thermal stress generated by applying a strong laser beam having absorptivity for the workpiece.

SUMMARY OF THE INVENTION

It is an object of the present invention to provide a silicon wafer dividing method and apparatus, which can form divided sections vertically from the front surface toward the back surface along deteriorated layers formed in the inside of a silicon wafer by applying a laser beam capable of passing through the silicon wafer, and can divide the silicon wafer reliably without exerting a thermal influence upon this silicon wafer.

According to the present invention, firstly, the above object of the present invention can be attained by a method of dividing a silicon wafer along predetermined dividing lines, comprising:

a deteriorated layer forming step for forming deteriorated layers exposed to at least a surface to which a laser beam is applied, from the inside of the silicon wafer by applying a pulse laser beam with a wavelength capable of passing through the silicon wafer to the silicon wafer along the dividing lines; and a dividing step for dividing the silicon wafer along the dividing lines by applying a laser beam having absorptivity for the silicon wafer to the silicon wafer along the dividing lines where the deteriorated layers have been formed, from the side to which the deteriorated layers have been exposed, to generate thermal stress along the dividing lines.

Preferably, the deteriorated layer formed in the above deteriorated layer forming step is desirably a molten-resolidified layer in which part of the wafer has been once molten and then re-solidified, and is formed across from one surface to the other surface of the silicon wafer.

According to the present invention, secondly, the above object can be attained by a dividing apparatus comprising:

a chuck table for holding a workpiece;

a first laser beam application means for applying a pulse laser beam with a wavelength capable of passing through the workpiece to the workpiece held on the chuck table;

a second laser beam application means for applying a laser beam having absorptivity for the workpiece to the workpiece held on the chuck table;

a processing-feed means for moving the chuck table and a combination of the first laser beam application means and the second laser beam application means relative to each other in a processing-feed direction; and an indexing-feed means for moving the chuck table and a combination of the first laser beam application means and the second laser beam application means relative to each other in an indexing-feed direction perpendicular to the processing-feed direction.

In the present invention, deteriorated layers exposed to at least the surface to which a laser beam is applied are formed, from the inside of the silicon wafer by applying a pulse laser beam with a wavelength capable of passing through the silicon wafer to the silicon wafer along the dividing lines in the deteriorated layer forming step and then, dividing portions are formed along the dividing lines by applying a laser beam having absorptivity for the silicon wafer to the silicon wafer, from the side to which the deteriorated layers have been exposed, to generate thermal stress along the dividing lines, so that the silicon wafer is divided. Since the divided sections of the dividing portions are formed vertically from the front surface toward the back surface of a plate-like object, it is possible to prevent the obtained chips from being damaged by oblique division of the silicon wafer which occurs when the divided sections are not formed vertically from the front surface toward the back surface of the plate-like object. According to the present invention, further, since the deteriorated layers formed in the inside of the silicon wafer in the deteriorated layer forming step are exposed to at least the surface to which the laser beam is applied, it is possible to reduce the value of stress required for dividing, whereby the output of the laser beam applied in the dividing step can be reduced and the silicon wafer can be divided with a small thermal influence without applying excessive thermal stress to the silicone wafer.

Further, since the dividing apparatus of the present invention comprises the first laser beam application beam for applying a pulse laser beam to the workpiece held on the chuck table and the second laser beam application means for applying a continuous wave laser beam to the workpiece held on the chuck table, the above deteriorated layer forming step and the dividing step can be carried out without necessity of changing the chuck table for holding the silicon wafer.

DETAILED DESCRIPTION OF THE PREFERRED EMBODIMENTS

A silicon wafer dividing method and apparatus according to preferred embodiments of the present invention will be described in detail hereinunder with reference to the accompanying drawings.

Figure 1:
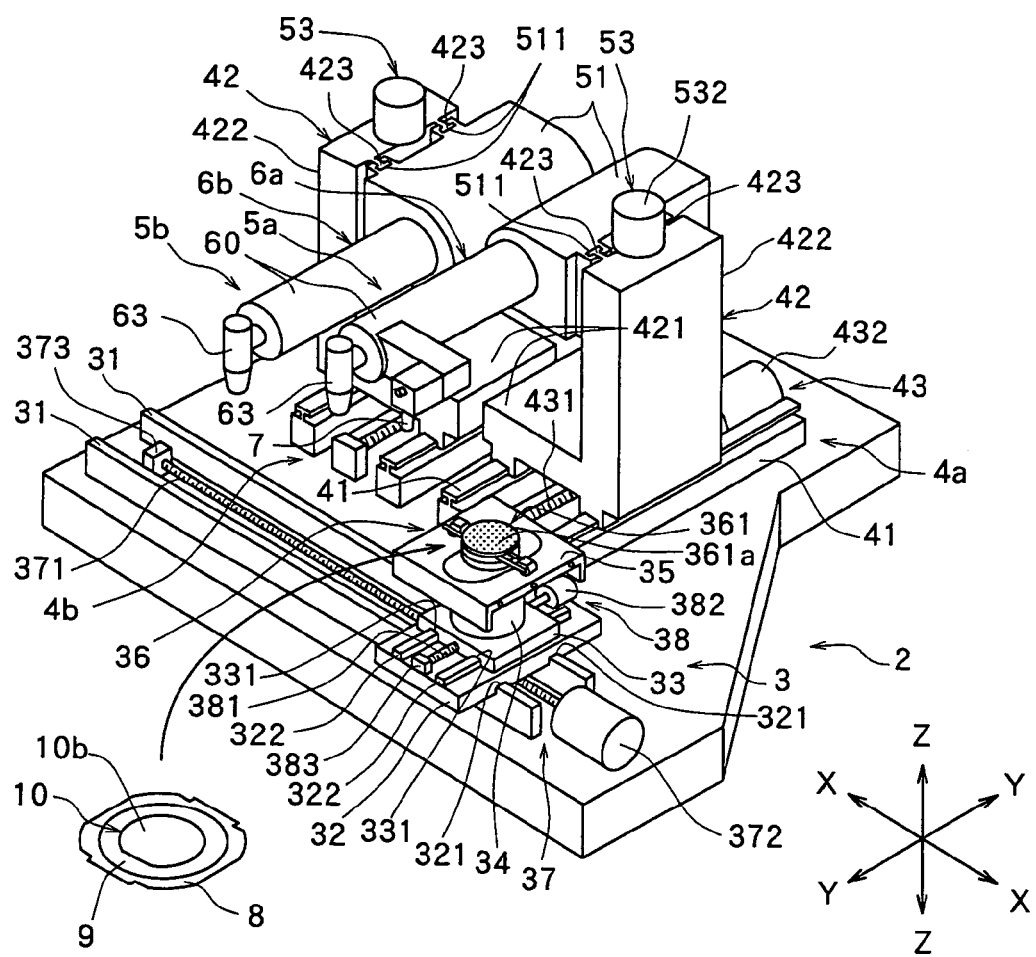
FIG. 1 is a perspective view of a diving apparatus constituted according to the present invention.

FIG. 1 is a perspective view of a dividing apparatus constituted according to the present invention. The dividing apparatus shown in FIG. 1 comprises a stationary base 2, a chuck table mechanism 3 for holding a workpiece, which is mounted on the stationary base 2 in such a manner that it can move in a processing-feed direction indicated by an arrow X, a first laser beam application unit support mechanism 4a mounted on the stationary base 2 in such a manner that it can move in an indexing-feed direction indicated by an arrow Y perpendicular to the processing-feed direction indicated by the arrow X, a first laser beam application unit 5a mounted on the first laser beam unit support mechanism 4a in such a manner that it can move in a direction indicated by an arrow Z, a second laser beam application unit support mechanism 4b, and a second laser beam application unit 5b mounted on the second laser beam application unit support mechanism 4b in such a manner that it can move in the direction indicated by the arrow Z.

The above chuck table mechanism 3 comprises a pair of guide rails 31 and 31 mounted on the stationary base 2 and arranged parallel to each other along the processing-feed direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 has an adsorption chuck 361 made of a porous material so that a disk-like semiconductor wafer as a workpiece is held on the workpiece placing surface 361a of the adsorption chuck 361 by a suction means that is not shown. The chuck table 36 is rotated by a pulse motor (not shown) installed in the cylindrical member 34.

The above first sliding block 32 has, on its undersurface, a pair of to-be-guided grooves 321 and 321 to be fitted to the above pair of guide rails 31 and 31 and has, on its top surface, a pair of guide rails 322 and 322 formed parallel to each other in the indexing-feed direction indicated by the arrow Y. The first sliding block 32 constituted as described above can move in the processing-feed direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment has a processing-feed means 37 for moving the first sliding block 32 along the pair of guide rails 31 and 31 in the processing-feed direction indicated by the arrow X. The processing-feed means 37 has a male screw rod 371 arranged between the above pair of guide rails 31 and 31 in parallel thereto and a drive source such as a pulse motor 372 for rotary-driving the male screw rod 371. The male screw rod 371 is, at its one end, rotatably supported to a bearing block 373 fixed on the above stationary base 2 and is, at its other end, transmission-coupled to the output shaft of the above pulse motor 372 by a speed reducer that is not shown. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 in the indexing-feed direction indicated by the arrow Y along the pair of guide rails 322 and 322 on the first sliding block 32. The first indexing-feed means 38 has a male screw rod 381 that is arranged between the above pair of guide rails 322 and 322 in parallel thereto and a drive source such as a pulse motor 382 for rotary-driving the male screw rod 381. The male screw rod 381 is, at its one end, rotatably supported to a bearing block 383 fixed on the top surface of the above first sliding block 32 and is, at its other end, transmission-coupled to the output shaft of the above pulse motor 382 by a speed reducer that is not shown. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above first laser beam application unit support mechanism 4a comprises a pair of guide rails 41 and 41 mounted on the stationary base 2 and arranged parallel to each other in the indexing-feed direction indicated by the arrow Y and a movable support base 42 mounted on the guide rails 41 and 41 in such a manner that it can move in the indexing-feed direction indicated by the arrow Y. This movable support base 42 comprises a movable support portion 421 movably mounted on the guide rails 41 and 41 and a mounting portion 422 mounted on the movable support portion 421. The mounting portion 422 is provided with a pair of guide rails 423 and 423, in parallel with each other, extending in the direction indicated by the arrow Z, that is, in a direction perpendicular to the workpiece placing surface 361a of the above chuck table 36, on one of its flanks. The first laser beam application unit support mechanism 4a in the illustrated embodiment has a second indexing means 43 for moving the movable support base 42 along the pair of guide rails 41 and 41 in the indexing-feed direction indicated by the arrow Y. This second indexing means 43 has a male screw rod 431 arranged between the above pair of guide rails 41 and 41 in parallel thereto and a drive source such as a pulse motor 432 for rotary-driving the male screw rod 431. The male screw rod 431 is, at its one end, rotatably supported to a bearing block (not shown) fixed on the above stationary base 2 and is, at its other end, transmission-coupled to the output shaft of the above pulse motor 432 by a speed reducer that is not shown. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The first laser beam application unit 5a in the illustrated embodiment comprises a unit holder 51 and a first laser beam application means 6a secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively. The first laser beam application unit 5a in the illustrated embodiment comprises a focusing point position adjusting means 53 for moving the unit holder 51 along the pair of guide rails 423 and 423 in the direction indicated by the arrow Z. The focusing point position adjusting means 53 has a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the first laser beam application unit 5a are moved along the guide rails 423 and 423 in the direction indicated by the arrow Z. The first laser beam application means 6a will be described in detail later.

An image pick-up means 7 is situated at the front end of a casing 60 constituting the above first laser beam application means 6a. This image pick-up means 7 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is transmitted to a control means that will be described later.

A description is subsequently given of the above second laser beam application unit support mechanism 4b and the second laser beam application unit 5b. As for the second laser beam application unit support mechanism 4b and the second laser beam application unit 5b, their constituent members having substantially the same functions as the constituent members of the above first laser beam application unit support mechanism 4a and the first laser beam application unit 5a are given the same reference symbols.

The second laser beam application unit support mechanism 4b is arranged parallel to the first laser beam application unit support mechanism 4a, and the movable support base 42 of the second laser beam application unit support mechanism 4b is opposed to the movable support base 42 of the above first laser beam application unit support mechanism 4a. Therefore, the first laser beam application unit 5a mounted to the mounting portion 422 constituting the movable support base 42 of the above first laser beam application unit support mechanism 4a and the second laser beam application unit 5b mounted to the mounting portion 422 constituting the movable support base 42 of the second laser beam application unit support mechanism 4b are arranged linearly symmetrically at positions close to each other. The image pick-up means is not provided at the front end of a casing 60 constituting the second laser beam application means 6b of the second laser beam application unit 5b.

Figure 2:
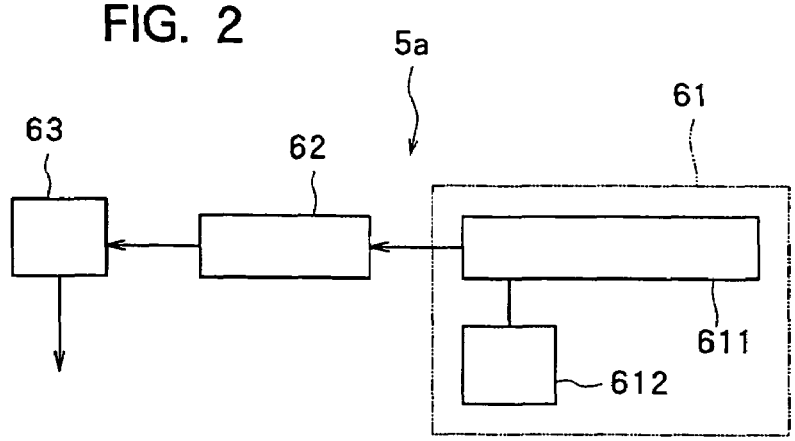
FIG. 2 is a schematic block diagram showing the constitution of a pulse laser beam application means provided in the dividing apparatus shown in FIG. 1.
Figure 3:
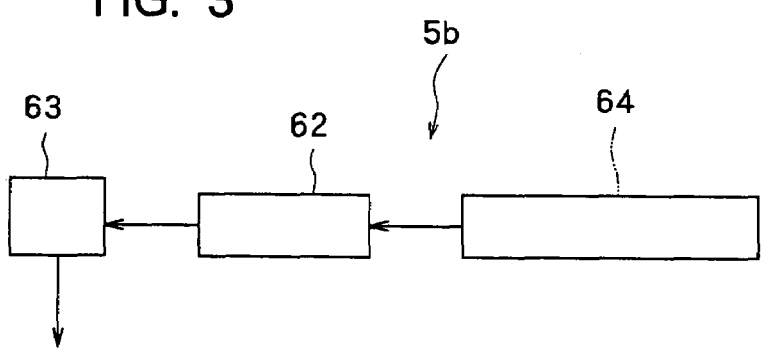
FIG. 3 is a schematic block diagram showing the constitution of a continuous wave laser beam application means provided in the dividing apparatus shown in FIG. 1.

The first laser beam application means 6a of the above first laser beam application unit 5a and the second laser beam application means 6b of the second laser beam application unit 5b will be described with reference to FIGS. 1 to 3.

The illustrated first laser beam application means 6a comprises a cylindrical casing 60 that is secured to the above unit holder 51 and extends substantially horizontally. In the casing 60, there are installed a pulse laser beam oscillation means 61 and a transmission optical system 62 as shown in FIG. 2. The pulse laser beam oscillation means 61 is constituted by a pulse laser beam oscillator 611 composed of a YAG laser oscillator or YVO4 laser oscillator and a repetition frequency setting means 612 connected to the pulse laser beam oscillator 611. The transmission optical system 62 comprises suitable optical elements such as a beam splitter, etc. A condenser 63 housing condensing lenses (not shown) constituted by a set of lenses that may be a known formation is attached to the end of the above casing 60 (see FIG. 1). A laser beam oscillated from the above pulse laser beam oscillation means 61 reaches the condenser 63 through the transmission optical system 62 and is applied from the condenser 63 to the workpiece held on the above chuck table 36 at a predetermined focusing spot diameter.

A description is subsequently given of the second laser beam application means 6b with reference to FIG. 3. As for the second laser beam application means 6b shown in FIG. 3,. the same members as in the first laser beam application means 6a shown in FIG. 2 are given the same reference symbols and their descriptions are omitted. The second laser beam application means 6b shown in FIG. 3 has a continuous wave laser beam oscillation means 64 composed of an Nd:YAG second harmonic laser beam oscillator and the like. A laser beam oscillated from this continuous wave laser beam oscillation means 64 reaches the condenser 63 through the transmission optical system 62 and is applied from the condenser 63 to the workpiece held on the above chuck table 36 at a predetermined focusing spot diameter.

Figure 4:
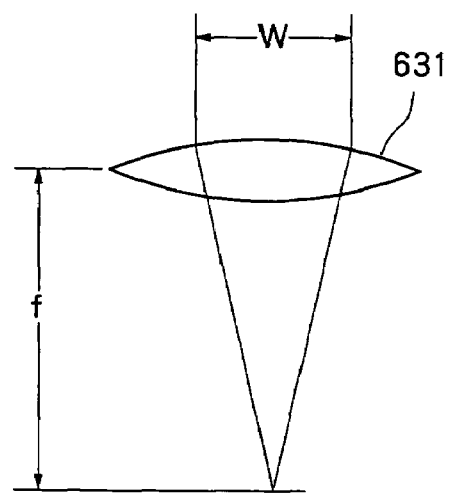
FIG. 4 is a schematic diagram for explaining the focusing spot diameter of a laser beam.

The focusing spot diameter D of the laser beams applied by the above-mentioned first laser beam application means 6a and second laser beam application means 6b will be described with reference to FIG. 4. That is, the focusing spot diameter D is defined by the expression D ($\mu$m)=$4 \times \lambda \times f/(\pi \times W)$ (wherein $\lambda$ is the wavelength ($\mu$m) of the laser beam, W is the diameter (mm) of the laser beam applied to an objective condenser lens 631, and f is the focusing distance (mm) of the objective condenser lens 631) when the laser beam having a Gauss distribution is applied through the objective condenser lens 631 of the condenser 63 as shown in FIG. 4.

A description is subsequently given of the method of dividing a silicon wafer along predetermined dividing lines by using the above-described dividing apparatus.

Figure 5:
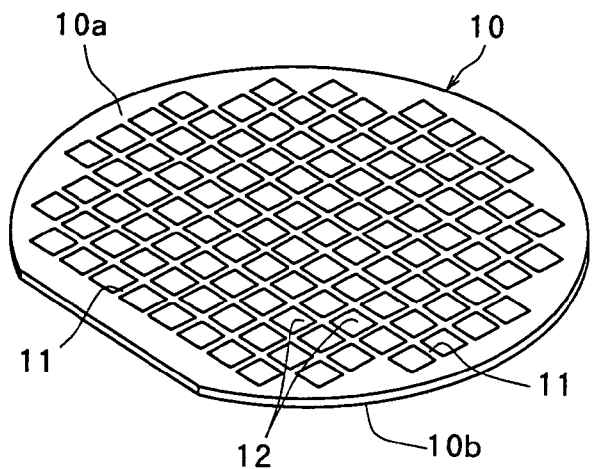
FIG. 5 is a perspective view of a silicon wafer to be divided by the dividing method of the present invention.

FIG. 5 is a perspective view of a silicon wafer 10 to be divided according to the present invention. In the silicon wafer 10 shown in FIG. 5, a plurality of dividing lines 11 are formed in a lattice pattern on the front surface 10a of the silicon wafer 10 shown in FIG. 5, and a circuit 12 is formed in a plurality of areas sectioned by the plurality of dividing lines 11. The method of dividing this silicon wafer 10 into individual semiconductor chips will be described with reference to FIGS. 6 to 14.

Figure 6:
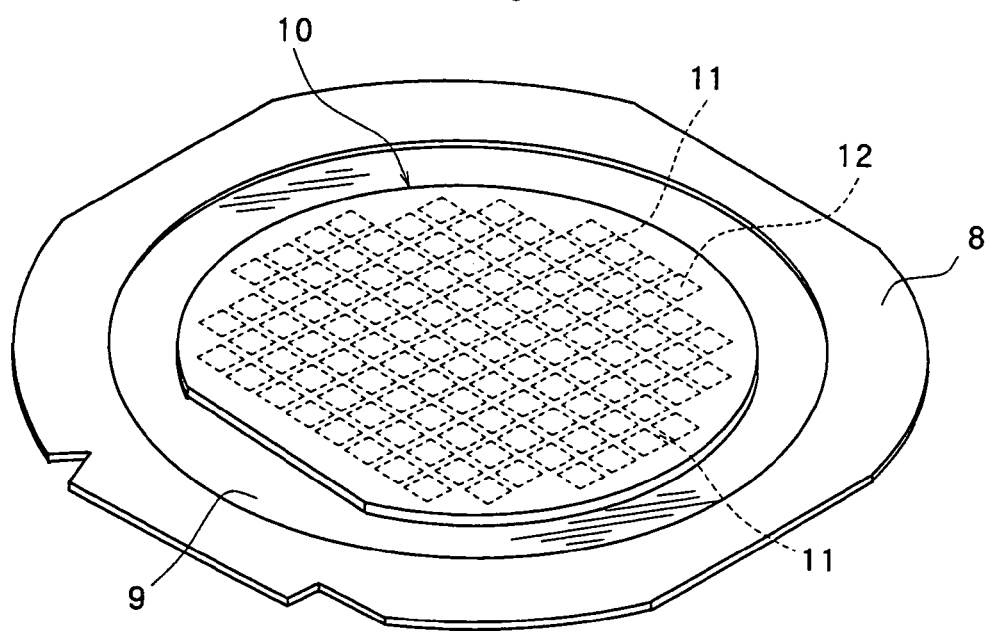
FIG. 6 is a diagram showing a dicing tape affixing step in the silicon wafer dividing method of the present invention.
Figure 7:
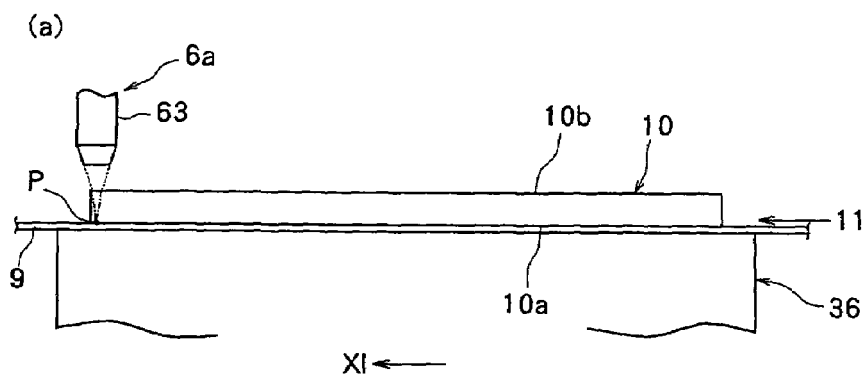
FIGS. 7(a) and 7(b) are diagrams for explaining an embodiment of the deteriorated layer forming step in the silicon wafer dividing method of the present invention.

In the illustrated embodiment, the step of putting the above silicon wafer 10 to a dicing tape is first carried out. That is, as shown in FIG. 6, the front surface 10a of the silicon wafer 10 is bonded to the top surface of the dicing tape 9 such as a polyolefin sheet, whose peripheral portion is mounted onto the silicon wafer 10 so as to cover the inner opening of its annular dicing frame 8. Therefore, the silicon wafer 10 is put to the dicing tape 9, with its back surface 10b facing up.

The silicon wafer 10 supported on the dicing frame 8 by the dicing tape 9 is then carried to the top of the adsorption chuck 361 of the chuck table 36 constituting the above chuck table mechanism 3 by a workpiece conveying means (not shown) as shown in FIG. 1 and suction-held on the adsorption chuck 361. The chuck table 36 suction-holding the silicon wafer 10 is moved along the guide rails 31 and 31 by the operation of the processing-feed means 37 to bring it to a position right below the image pick-up means 7 mounted onto the first laser beam application unit 5a.

After the chuck table 36 is positioned right below the image pick-up means 7 as described above, the image pick-up means 7 and a control means (not shown) carry out image processing such as pattern matching to align streets formed on the silicon wafer 10 in a first direction with the condenser 63 of the first laser beam application means 6a constituting the first laser beam application unit 5a and the condenser 63 of the second laser beam application means 6b constituting the second laser beam application unit 5b, along the streets, thereby performing the alignment of a laser beam application position. Similarly, the alignment of the laser beam application position is also carried out on streets formed on the silicon wafer 10 in a second direction. Although the front surface 10a, on which the dividing lines 11 are formed, of the silicon wafer 10 faces down at the time when the above alignment is carried out, the dividing line 11 can be imaged from the back surface 10b as the image pick-up means 7 comprises infrared illuminating means, an optical system for capturing infrared radiation and an image pick-up device (infrared CCD) for outputting an electric signal corresponding to the infrared radiation as described above.

After the dividing line 11 formed on the silicon wafer 10 held on the chuck table 36 is detected and the alignment of the laser beam application position is carried out as described above, the step of forming a deteriorated layer exposed to at least the surface to which a laser beam is applied, from the inside of the silicon wafer 10 by applying the laser beam capable of passing through the silicon wafer 10 along the dividing line 11 is carried out. In this deteriorated layer forming step, as shown in FIG. 7(a), the chuck table 36 is moved to a laser beam application area where the condenser 63 of the first laser beam application means 6a for applying a pulse laser beam is located, to bring one end (left end in FIG. 7(a)) of the predetermined dividing line 11 to a position right below the condenser 63 of the first laser beam application means 6a. The chuck table 36, that is, the silicon wafer 10 is moved in the direction indicated by the arrow X1 in FIG. 7(a) at a predetermined feed rate while a pulse laser beam capable of passing through the silicon wafer 10 is applied from the condenser 63. Then, when the application position of the condenser 63 of the first laser beam application means 6a reaches the other end of the dividing line 11 as shown in FIG. 7(b), the application of the pulse laser beam is suspended and the movement of the chuck table 36, that is, the silicon wafer 10 is stopped. In this deteriorated layer forming step, by setting the focusing point P of the pulse laser beam to the vicinity of the front surface 10a (undersurface) of the silicon wafer 10, a deteriorated layer 110 is exposed to the front surface 10a (undersurface) and is also formed toward the inside. This deteriorated layer 10 is formed as a molten-resolidified layer in which part of the wafer has been once molten and then re-solidified.

The processing conditions in the above deteriorated layer forming step are set as follows, for example.

Figure 8:
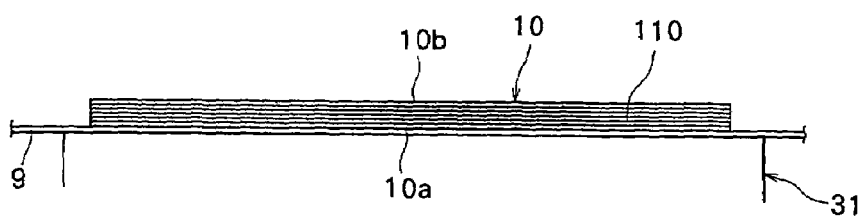
FIG. 8 is a diagram of deteriorated layers formed in the silicon wafer in the deteriorated layer forming step shown in FIGS. 7(a) and 7(b)

Light source: LD excited Q switch Nd:YVO4 laser
Wavelength: 1,064 nm pulse laser
Pulse output: 10 μJ
Focusing spot diameter: 1 μm
Pulse width: 40 ns
Peak power density of focusing point: $3.2 \times 10^{10}$ W/cm$^2$
Repetition frequency: 100 kHz
Processing-feed rate: 100 mm/sec When the silicon wafer 10 is thick, the above deteriorated layer forming step is carried out several times by changing the focusing point P stepwise to form a plurality of deteriorated layers 110 as shown in FIG. 8. Since the thickness of the deteriorated layer formed each time under the above processing conditions is about 50 μm, six deteriorated layers are formed in a 300 μm thick silicon wafer 10 in the illustrated embodiment. As a result, the deteriorated layers 110 formed in the inside of the silicon wafer 10 extend across from the front surface 10a to the back surface 10b along the dividing line 11 and is exposed to the front surface 10a and the back surface 10b of the silicon wafer 10.

After the deteriorated layers 110 are formed along the dividing line 21 in a predetermined direction formed on the silicon wafer 10 as described above, the chuck table 36 is moved by the interval between adjacent dividing lines 11 in the indexing-feed direction indicated by the arrow Y, and processing-fed while a pulse laser beam is applied again as described above. After the above processing-feed and indexing-feed are carried out along all the dividing lines 11 formed in the predetermined direction, the chuck table 36 is turned at 90° to carry out the above processing-feed and indexing-feed along dividing lines 11 formed in a direction perpendicular to the above predetermined direction, thereby making it possible to form deteriorated layers 110 in the inside of the silicon wafer 10 along all the dividing lines 11.

A description is subsequently given of deteriorated layers formed along the dividing lines 11 of the silicon wafer 10 in the deteriorated layer forming step according to another embodiment of the present invention with reference to FIG. 9.

Figure 9:
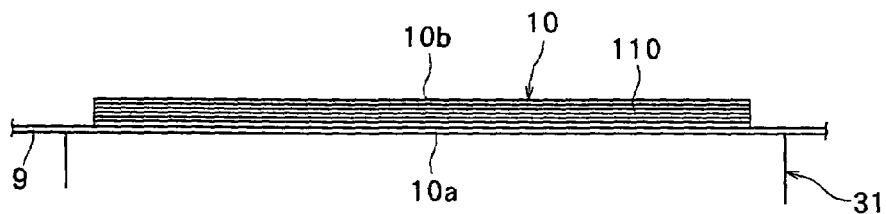
FIG. 9 is a diagram of deteriorated layers formed in the silicon wafer in another embodiment of the deteriorated layer forming step in the silicon wafer dividing method of the present invention.

In the embodiment shown in FIG. 9, a first deteriorated layer is formed by applying a pulse laser beam with its focusing point on a position above from the front surface 10a (undersurface) of the silicon wafer 10 by a predetermined distance, and the focusing point is then moved upward stepwise to form deteriorated layers 110 exposed to the back surface 10b (top surface). Therefore, in the illustrated embodiment shown in FIG. 9, the deteriorated layers 110 are exposed only to the back surface 10b (top surface) of the silicon wafer 10.

The deteriorated layers 110 formed in the inside of the silicon wafer 10 can be broken with extremely small stress because their strengths have been reduced.

The relationship between the depth of the deteriorated layer 110 formed along the dividing lines 11 of the silicon wafer 10 in the above deteriorated layer forming step and stress required for dividing along the dividing lines 11 will be explained based on an experimental example.

EXPERIMENTAL EXAMPLE

Figure 13:
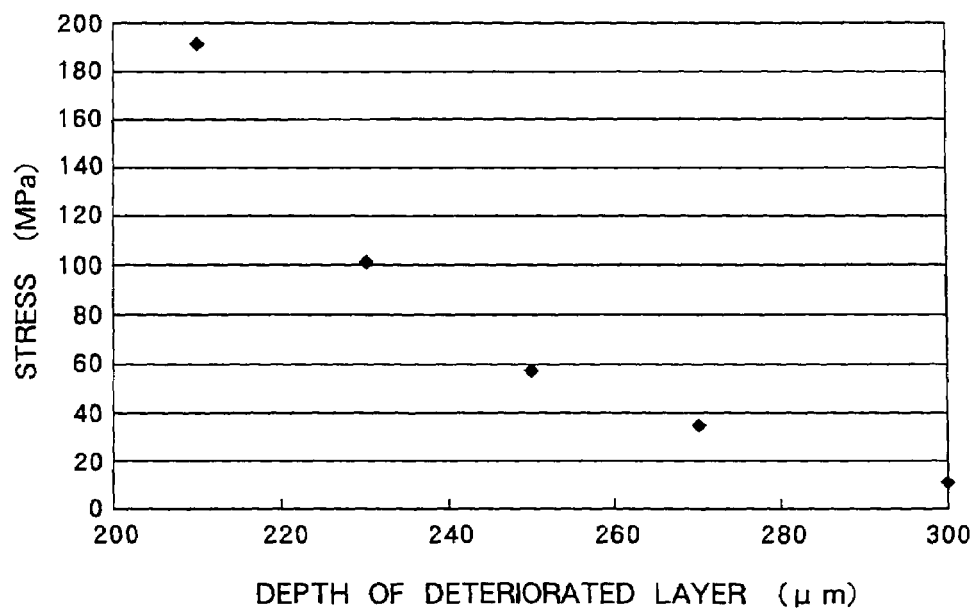
FIG. 13 is a graph showing the relationship between the depth of the deteriorated layer formed in the deteriorated layer forming step and bending stress required for dividing the silicon wafer in the silicon wafer dividing method of the present invention.

Deteriorated layers which differed from one another in depth were formed in a silicon wafer having a diameter of 6 inches and a thickness of 300 μm in the above-described deteriorated layer forming step to measure bending stress required for breaking the deteriorated layers, by a three-point bending test method. FIG. 13 shows the results of the experiment, in which the depth (μm) of the deteriorated layer is plotted on the horizontal axis and bending stress (MPa) required for breaking the dividing line 11 is plotted on the vertical axis. As understood from FIG. 13, as the depth of the deteriorated layer increases, that is, the proportion of the thickness of the deteriorated layer to the thickness of the silicon wafer increases, bending stress (MPa) required for breaking the dividing line 11 becomes smaller. Particularly when the depth of the deteriorated layer is 300 μm, that is, the deteriorated layer is formed across from one surface to the other surface of the silicon wafer, bending stress (MPa) required for breaking the dividing line 11 is 10 MPa which is 1/3.5 as compared with the bending stress required when the depth of the deteriorated layer is 90% (270 μm) based on the thickness (300 μm) of the silicon wafer. Therefore, the deteriorated layer 110 formed along the dividing line 11 of the silicon wafer 10 in the above deteriorated layer forming step is desirably formed across from one surface to the other surface of the silicon wafer.

The above deteriorated layer forming step is followed by the dividing step for dividing the silicon wafer 10 along the dividing lines 11 by applying a laser beam from the side to which the deteriorated layers 110 have been exposed along the dividing lines 11 where the deteriorated layers 110 have been formed to generate thermal stress along the dividing lines 11. At this time, since the deteriorated layers 110 are exposed to the back surface 10b (top surface) of the silicon wafer 10 in the illustrated embodiment shown in FIG. 8 and FIG. 9, it is not necessary to turn the silicon wafer 10 upside down and hold it on the chuck table 36 again and hence, the dividing step can be carried out on the silicon wafer 10 in a state of the deteriorated layer forming step having been completed.

The dividing step will be described with reference to FIG. 10 and FIG. 11. The embodiment shown in FIG. 10 and FIG. 11 is a case where the dividing step is carried out on the silicon wafer 10 having the deteriorated layers 110 formed in the above deteriorated layer forming step in such a manner that they are exposed to the front surface 10a (undersurface) and the back surface 10b (top surface), as shown in FIG. 8.

Figure 10:
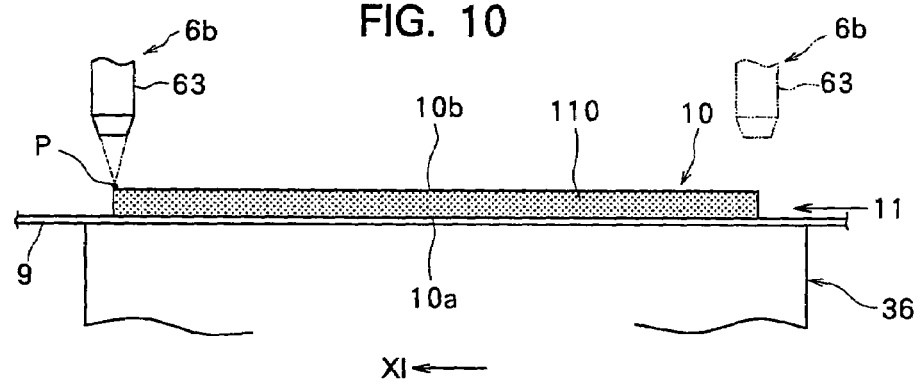
FIG. 10 is a diagram showing the dividing step in the silicon wafer dividing method of the present invention.
Figure 11:
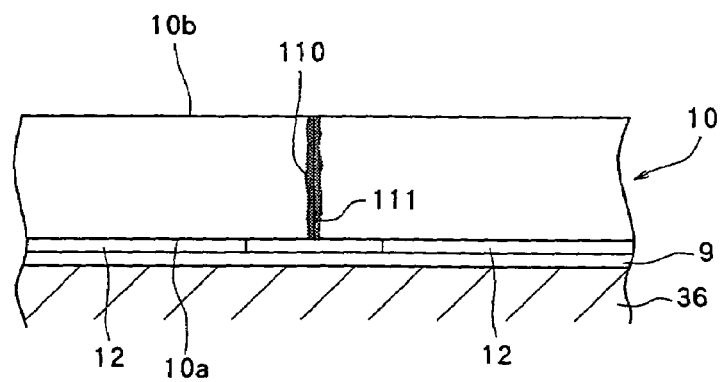
FIG. 11 is an enlarged view of a dividing portion which is formed along a dividing line by carrying out the dividing step on a silicon wafer having the deteriorated layers shown in FIG. 8.

That is, as shown in FIG. 10, the chuck table 36 is moved to a laser beam application area where the condenser 63 of the second laser beam application means 6b for applying a continuous wave laser beam is located, to bring one end (left end in FIG. 10) of a predetermined dividing line 11 to a position right below the condenser 63 of the second laser beam application means 6b. The chuck table 36, that is, the silicon wafer 10 is moved in the direction indicated by the arrow X1 in FIG. 10 at a predetermined processing-feed rate while a continuous wave laser beam having absorptivity for the silicon wafer 10 is applied from the condenser 63. When the application position of the condenser 63 reaches the other end (right end in FIG. 10) of the predetermined dividing line 11, the application of the laser beam is suspended and the movement of the chuck table 36, that is, the silicon wafer 10 is stopped. In this dividing step, the focusing point P of the continuous wave laser beam is set onto the back surface 10b (top surface) of the wafer 10 and the dividing line 11 in which the deteriorated layers 110 have been formed is heated to generate thermal stress so as to provide a heat shock. As a result, as shown in FIG. 11, a dividing portion 111 is formed along the dividing line 11 in which the deteriorated layers 110 have been formed to divide the silicon wafer 10 along the dividing line 11. The laser beam applied along the dividing line 11 where the deteriorated layers 110 have been formed in the dividing step is applied at an output high enough to heat the silicon wafer 10 so as to provide a suitable temperature gradient (100 to 400°) and does not melt silicon.

Figure 12:
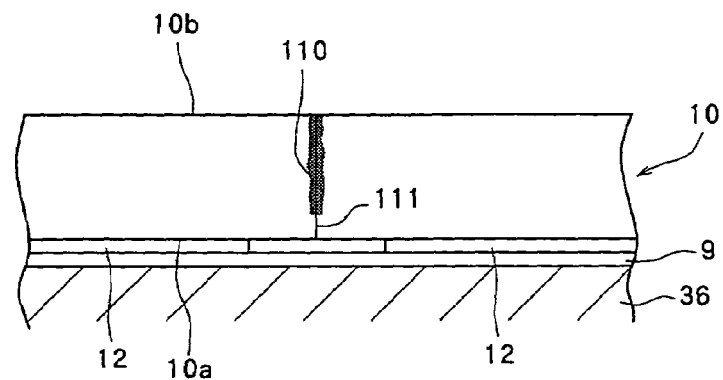
FIG. 12 is an enlarged view of a dividing portion which is formed along a dividing line by carrying out the dividing step on a silicon wafer having the deteriorated layers shown in FIG. 9.

FIG. 12 shows a case in which the above dividing step is carried out on the silicon wafer 10 having the deteriorated layers 110 exposed only to the back surface 10b (top surface) as shown in FIG. 9 in the above deteriorated layer forming step. That is, a dividing portion 111 is formed along the dividing line 11 where the deteriorated layers 110 have been formed like the above-mentioned embodiment, to divide the silicon wafer 10, as shown in FIG. 12.

The processing conditions in the above dividing step are set as follows, for example.

Light source: LD excited Nd:YAG second harmonic laser (CW)
Wavelength: 532 nm
Output: 10 W
Focusing spot diameter: 0.5 mm (heating a relative wide area including the deteriorated layer 110)
Processing-feed rate: 100 mm/sec After the dividing step is carried out as described above, the chuck table 36 is moved by the interval between adjacent dividing lines 11 in the indexing-feed direction indicated by the arrow Y in FIG. 1 and processing-fed while a continuous wave laser beam is applied again in the same manner as above. After the above processing-feed and indexing-feed are carried out along all the dividing lines 11 formed in the predetermined direction, the chuck table 36 is turned at 90° to carry out the above processing-feed and indexing-feed along dividing lines 11 formed in a direction perpendicular to the above predetermined direction. Thereby, dividing portions 111 are formed along the dividing lines 21 formed in the wafer 10, thereby dividing the wafer 10. Although the wafer 10 is divided into individual semiconductor chips by forming the dividing portions 111 along the dividing lines 11, the individual semiconductor chips do not fall apart and the form of the wafer is maintained because the dicing tape 8 is affixed to the back surface 10b of the wafer 10.

The divided section of the dividing portion 111 is formed vertically from the back surface 10b (top surface) toward the front surface 10a of the wafer 10, as shown in FIG. 11 and FIG. 12. That is, since the deteriorated layers 110 formed along the dividing lines 11 of the wafer 10 are in a state where part of the wafer has been molten and then re-solidified (i.e., not single crystal), the wafer 10 hardly cracks in a direction other than the dividing lines 11. Therefore, the wafer 10 does not break by producing cracks in a direction different from the dividing lines 11. Consequently, the circuits 12 are not damaged by the dividing portions 111. Further, since the deteriorated layers 110 are exposed to at least one surface of the wafer 10 along the dividing lines 11 and a laser beam is applied from the side to which the deteriorated layers 110 have been exposed with the consequence that stress required for dividing is reduced, the output of the continuous wave laser beam to be applied in the above dividing step can be reduced, thereby making it possible to reduce the costs of the equipment and power as well as the influence of heat upon the wafer. Thus, as the output of the laser beam can be reduced, the silicon wafer is not influenced by heat.

The wavelength of the laser beam applied in the above dividing step and the absorption coefficient of silicon will be described hereinbelow with reference to FIG. 14.

Figure 14:
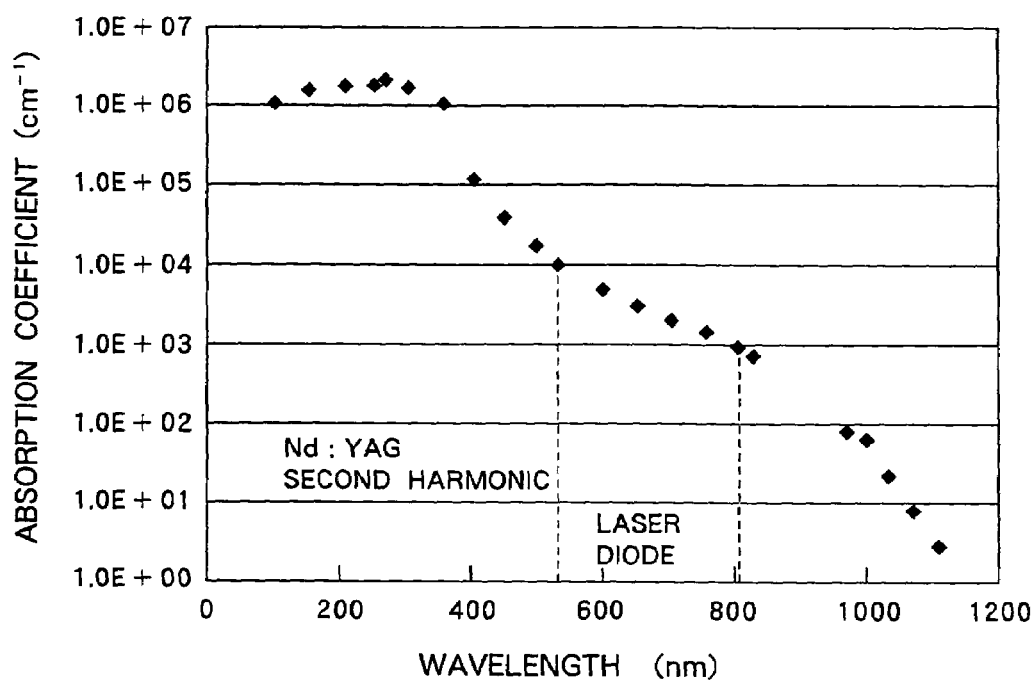
FIG. 14 is a graph showing the relationship between wavelength of a laser beam and the absorption coefficient of silicon.

In FIG. 14, the horizontal axis shows the wavelength (nm) of light and the vertical axis shows the absorption coefficient of silicon. As shown in FIG. 14, as the wavelength of light becomes lower, the absorption coefficient of silicon becomes higher. Since as described above, the strength of the deteriorated layer 110 formed in the inside of the silicon wafer 10 is reduced and the silicon wafer 10 can be divided with extremely small thermal stress, the silicon wafer 10 can be divided with a low-output CW laser. Therefore, a laser beam from an inexpensive and easily controllable laser diode having an output of about 10 W or low-output Nd:YAG second harmonic laser can be used.

A description is subsequently given of the condenser of the second laser beam application means 6b for applying a continuous wave laser beam according to another embodiment of the present invention with reference to FIG. 15.

Figure 15:
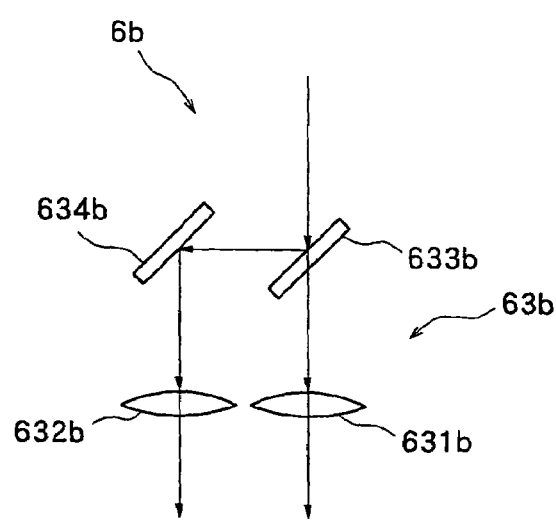
FIG. 15 is a schematic diagram showing another example of a condenser constituting the continuous wave laser beam application means provided in the dividing apparatus shown in FIG. 1.

The condenser 63b of the second laser beam application means 6b shown in FIG. 15 comprises a first objective condenser lens 631b and a second objective condenser lens 632b. A half mirror 633b is installed on an upstream side of the first objective condenser lens 631b and a mirror 634b is installed on an upstream side of the second objective condenser lens 632b. When a laser beam oscillated from the continuous wave laser beam oscillation means 64 shown in FIG. 3 reaches the condenser 63b constituted as described above through the transmission optical system 62, half of the laser beam is reflected by the half mirror 633b and the other half is transmitted through the half mirror 633b. As a result, the laser beam transmitted through the half mirror 633b is applied from the first objective condenser lens 631b to the workpiece and the laser beam reflected by the half mirror 633b is reflected by the mirror 634b and is applied to the workpiece from the second objective condenser lens 632b. As the laser beam applied in the above dividing step may have low output, the above dividing step can be carried out along two dividing lines at the same time by using the condenser 63b constituted as described above, thereby making it possible to enhance productivity. By combining another half mirror with another objective condenser lens to apply a plurality of laser beams to the workpiece, productivity can be further enhanced.

What is claimed is:

1. A method of dividing a silicon wafer along a predetermined line, consisting of
   applying to the wafer a pulse laser beam with a wavelength that passes through the wafer along a dividing line to form a deteriorated layer in the wafer along the dividing line, the deteriorated layer being exposed to a least a surface of the wafer to which the pulse laser beam is applied; and
   applying to the surface of the wafer a focused continuous wave laser beam having absorptivity into the silicon wafer along the dividing line, where the deteriorated layer has been formed and exposed, to thus divide the silicon wafer along the dividing line by thermal stresses generated in the wafer along the dividing lines by the continuous wave laser beam.

2. The dividing method of claim 1, wherein the deteriorated layer is a molten-resolidified layer in which part of the wafer has been once molten and then re-solidified.

3. The dividing method according to claim 2, wherein the deteriorated layer extends between said surface to opposite surfaces of the wafer.

4. The dividing method according to claim 2, wherein said applying to the silicon wafer the continuous wave laser beam imposes a thermal shock to the surface of the wafer along the dividing line.

5. The dividing method according to claim 2, wherein the surface of the wafer is an upper surface of the wafer placed on a chuck table.

6. The dividing method according to claim 2, wherein the continuous wave laser beam is applied to provide a temperature gradient in the wafer and not to melt the wafer.

7. The dividing method according to claim 2, wherein the continuous wave laser beam is produced by a YAG second harmonic laser.

8. The dividing method according to claim 2, wherein the continuous wave laser beam has a focusing spot of 0.5 mm on the surface of the wafer.

9. A method of dividing a silicon wafer along a predetermined line, consisting essentially of applying to the wafer a pulse laser beam with a wavelength that passes through the wafer along a dividing line to form a deteriorated layer in the wafer along the dividing line, the deteriorated layer being exposed to a least a surface of the wafer to which the pulse laser beam is applied; and applying to the surface of the wafer a focused continuous wave laser beam having absorptivity into the silicon wafer along the dividing line, where the deteriorated layer has been formed and exposed, to thus divide the silicon wafer along the dividing line by thermal stresses generated in the wafer along the dividing lines by the continuous wave laser beam.

* * * * *